United States Patent
Hsieh

[19]
[11] Patent Number: 6,143,665
[45] Date of Patent: Nov. 7, 2000

[54] METHOD OF ETCHING

[75] Inventor: Chi-Kuo Hsieh, Hsinchu, Taiwan

[73] Assignee: United Semiconductor Corp, Hsinchu, Taiwan

[21] Appl. No.: 08/998,769

[22] Filed: Dec. 29, 1997

[30] Foreign Application Priority Data

Oct. 29, 1997 [TW] Taiwan .................................. 86116025

[51] Int. Cl.$^7$ ................................................ H01L 21/461
[52] U.S. Cl. ........................ 438/710; 438/711; 438/723; 216/67
[58] Field of Search .................... 438/710, 711, 438/723; 216/67

[56] References Cited

U.S. PATENT DOCUMENTS 5,562,801  10/1996  Nulty et al. ......................... 156/643.1
5,817,579  10/1998  Ko et al. .............................. 438/740
5,874,362   2/1999  Wong et al. ........................... 438/719

Primary Examiner—Benjamin L. Utech
Assistant Examiner—Charlotte A. Brown
Attorney, Agent, or Firm—J.C. Patents; Jiawei Huang

[57] ABSTRACT

An improved method for oxide etching that uses of a mixture of etching gases including $CF_4/C_4F_8/CO/Ar/N_2$ such that etching selectivity between oxide and other materials can be increased. Furthermore, the addition of a cleaning step between etching operations in this invention is able to remove most of the deposited polymers formed during the etching operation, hence etching stop phenomenon can be prevented. Also, the presence of $N_2$ in the etching gas mixture is able to prevent the formation of polymers on the sidewalls of an etched contact opening. Hence, when metal is subsequently deposited into the opening to form a self-aligned silicide layer, there are few polymers to react with the metal atoms to form a layer of high resistance material on the sidewalls of the opening. Thus, reliability of the device can be maintained.

12 Claims, 2 Drawing Sheets

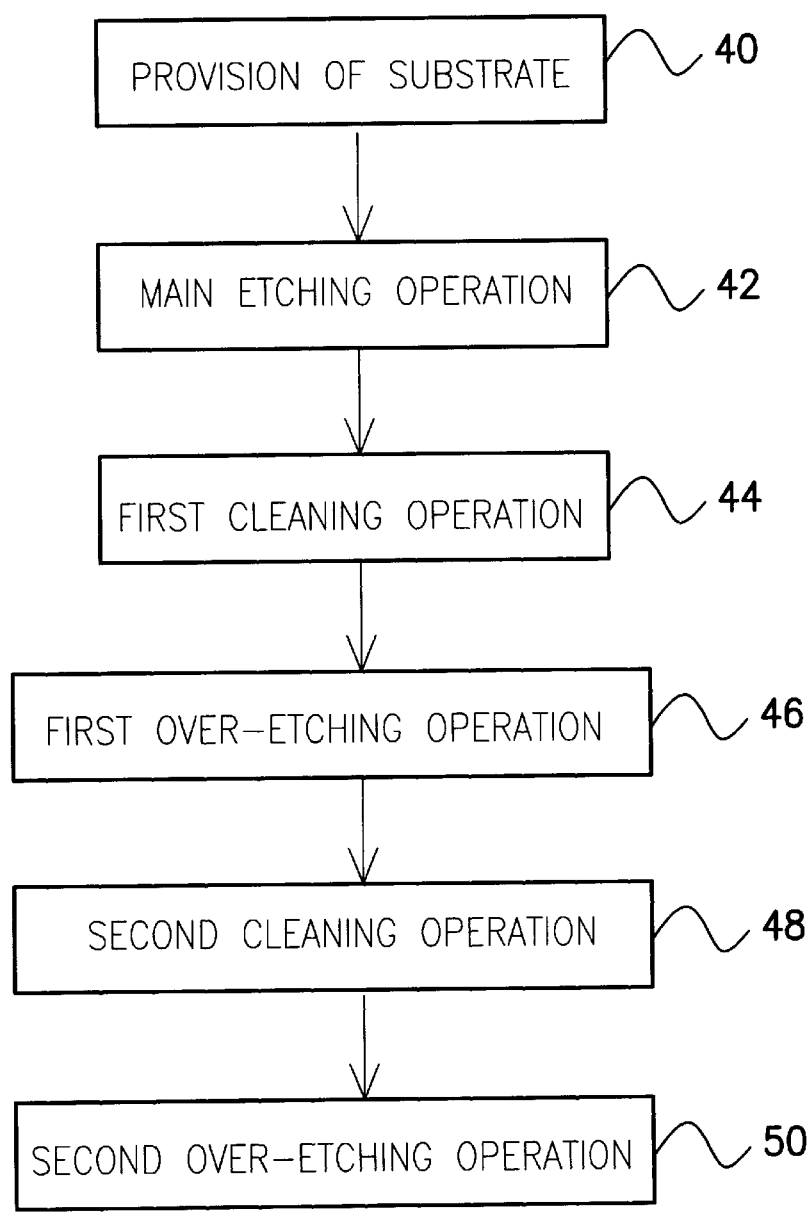

METHOD OF ETCHING

BACKGROUND OF THE INVENTION

1. Field of Invention

The present invention relates to a semiconductor manufacturing process. More particularly, the present invention relates to an etching process that uses carbon monoxide (CO) and fluorobutane ($C_4F_8$) during plasma enhanced oxide etching in order to increase the etching selectivity and to avoid the premature etching stop for the etching process.

2. Description of Related Art

Earlier plasma-enhanced method of etching employs fluoromethane ($CF_4$), fluoroform ($CHF_3$) and argon (Ar) as the etching gases. However, because insufficient polymers are generated by the etching gases to protect other layers in the semiconductor structure, subsequently, high-density plasma (HDP) oxide etching process using fluorobutane ($C_4F_8$) and carbon monoxide (CO) as the etching gases is developed. Under the high-density plasma oxide etching operation, the operating pressure is smaller than about 50 milliTorr (mT), hence the by-product formed by the etching gases $C_4F_8$ and CO can be easily pumped out. In addition, concentration of ions in the plasma used in the HDP process is very high. Therefore, although a larger amount of polymers is deposited during the etching operation, there will be no occurrence of the etching stop phenomenon. The etching stop phenomenon refers to a sudden slowing of the etching rate due to too much deposition of polymers blocking the plasma etching action.

However, in a plasma-enhanced mode of oxide etching, the operating pressure is higher than 200 mT, and is unsuitable for using etching gases $C_4F_8$ and CO.

In a HDP oxide etching process, the gaseous fluorobutane ($C_4F_8$) can serve as an etching gas and at the same time a source gas for forming the polymers. This is because gaseous carbon difluoride ($CF_2$) can be ionized out from the gaseous $C_4F_8$ to form polymers protecting other semiconductor layers and increasing its etching selectivity. Furthermore, free radicals of fluorine (F) can also be ionized out from the gaseous $C_4F_8$ to act as the source etchant. On the other hand, carbon monoxide (CO) serves as a gaseous agent for trapping free radicals of fluorine. Therefore, in the etching process, the addition of carbon monoxide helps to lower the etching rate. In other words, there is a tug-of-war going on between etching away the oxide layer and depositing a polymer layer on the surface. Consequently, when the etching rate is higher than the polymer deposition rate, etching of the oxide layer will continue. On the other hand, when the polymer deposition rate is higher than the etching rate, the etching of the oxide layer will simply stop. Moreover, the polymer layer will tend to roughen the etched surface so that it becomes very difficult to measure thickness with a thermal wave monitor.

Furthermore, if the polymer by-product of the etching operation is not thoroughly removed before the deposition of metal to form a self-aligned silicide (Salicide) layer, the polymer will react with the metal atoms to form high resistance layers that can affect the reliability of the product.

FIG. 1 is a block diagram illustrating the steps in carrying out a first conventional etching process. First, in step 10 of FIG. 1, a substrate is provided. The substrate has, for example, an oxide layer and a silicon nitride layer or a polysilicon layer formed over the substrate. Then, the substrate is placed inside a reaction chamber to carry out etching step 12, wherein the gas pressure inside the reaction chamber is set to about 300 milliTorr and the electrical power set to about 1300 Watts. In the conventional process, a gaseous mixture containing $CHF_3/CF_4/Ar$ is passed into the reaction chamber, wherein the gas flow rates of $CHF_3$, $CF_4$ and Ar are 30, 30 and 400 SCCM (Standard Cubic Centimeter Per Minute), respectively.

Table 1A and Table 1B below show the test results of using a first conventional etching process. The purpose of the experiment is to compare the etching selectivity between etching an oxide material versus other materials such as silicon nitride, doped polysilicon and photoresist. In the tables, PECVD represents plasma enhanced chemical vapor deposition method; hence, PECVD-Oxide and PECVD-Nitride represent plasma enhanced chemical deposited oxide layer and nitride layer respectively.

TABLE 1A

|  | ETCHING RATE (Å/Min) |
| --- | --- |
| PECVD-Oxide | 5882 |
| PECVD-Nitride | 4298 |
| Doped Polysilicon | 627 |
| Photoresist | 1132 |

TABLE 1B

|  | ETCHING SELECTIVITY |
| --- | --- |
| PECVD-Oxide/PECVD-Nitride | 1.37 |
| PECVD-Oxide/Doped Polysilicon | 9.38 |
| PECVD-Oxide/Photoresist | 5.2 |

As seen in Table 1A and Table 1B, the result shows a rather poor etching selectivity for a conventional etching process. The etching selectivity ratio between PECVD-Oxide and PECVD-Nitride is as low as 1.37.

Moreover, after the oxide layer above the substrate is etched to form a contact opening, polymers will also be deposited on the sidewalls and bottom of the opening. When these polymers are allowed to react with self-aligned silicide material in a subsequent process, a layer of reacted material will form on the sidewalls of the opening. Hence, it is critical to clean up the polymers before depositing metal; otherwise, the metal atoms can react with the polymers to form a high resistance layer affecting the reliability of the device.

FIG. 2 is a block diagram illustrating the steps in carrying out a second conventional etching process. First, as shown in step 20 of FIG. 2, a substrate is provided. An oxide layer having a thickness of about 4000 Å formed by a thermal oxidation method is formed over the substrate, and a BPTEOS layer having a thickness of about 7100 Å is also formed over the oxide layer. Next, the substrate is placed inside a reaction chamber, and then the gas pressure is set to about 200 mT and the power rating set to about 1500 Watts. Subsequently, a gaseous mixture of $CF_4/C_4F_8/CO/Ar/N_2$ having gas flow rates of 20, 4, 200, 600 and 20 SCCM respectively is passed into the reaction chamber for about 120 seconds to carry out the main etching step 22. Thereafter, a first thickness monitoring of the BPTEOS layer is conducted. Next, under the same pressure setting, power setting and the same gaseous mixture and the same respective flow rates of individual gases, an over-etching step 24 is carried out for about 60 seconds. Thereafter, a second thickness monitoring of the thermally formed oxide layer is conducted. However, in the above conventional etching operation, because of the difficulties in ensuring a higher etching rate than a polymers deposition rate, it is quite easy for the etching to stop before the etching operation ends.

Table 2 below shows the test result of using the second conventional etching process. The purpose of Table 2 is to compare the change in etching rate between the main etching step and the over-etching step. In this second convention etching process, the etching rate of the BPTEOS layer for the first 120 seconds is about 3915 (Å/min), but when the etching is continued for another 60 seconds, the etching rate of the oxide layer in this second period becomes just 928 (Å/min).

TABLE 2

|  | Before Etching | First Thickness Monitoring (BPTEOS) | Second Thickness Monitoring (Thermal Oxide) |
|---|---|---|---|
| Thickness (Å) | 11153 | 3322 | 2393 |
| Etching Rate (Å/min) |  | 3915 | 928 |

In light of the foregoing, there is a need to improve the above etching methods.

SUMMARY OF THE INVENTION

Accordingly, the present invention is directed to provide an improved plasma enhanced mode of oxide etching that improves the etching selectivity of oxides with respect to other materials. The improved method can prevent the occurrence of the etching stop phenomenon before the end of the etching process. Furthermore, the method is also able to prevent the formation of polymers on the sidewalls of a contact opening so that there will be no polymers to react with subsequently deposited metal atoms to form a high resistance layer.

To achieve these and other advantages and in accordance with the purpose of the invention, as embodied and broadly described herein, the invention provides an improved method of etching that can increase the selectivity of plasma enhanced mode of oxide etching. The method comprises the steps of providing a substrate that has an oxide layer formed thereon. Next, the substrate is placed inside a reaction chamber, and then a mixture of etching gases including $CF_4/C_4F_8/CO/Ar/N_2$ is passed into the reaction chamber, wherein the gas pressure inside the reaction chamber is set to about 200 mT and the power rating is set to about 1500 Watts. Through the generation of a larger amount of polymers, etching selectivity of the oxide layer is increased.

In another aspect, an improved method of oxide etching is provided comprising the steps of providing a substrate that has an oxide layer formed thereon. Next, a main etching operation for etching the oxide layer is carried out first, and then a first cleaning operation is performed in order to clear away most of the polymers generated on the substrate surface. Thereafter, a first over-etching operation, a second cleaning operation and a second over-etching operation are sequentially carried out.

In the main etching operation, the substrate is placed inside a reaction chamber, and a gaseous etching mixture including $CHF_3/CF_4/Ar$ is passed. Furthermore, the reaction chamber is set to a pressure of about 300 mT and a power rating of about 1300 Watts.

In both the first and the second cleaning operations, the reaction chamber is set to a pressure of about 100 mT, and a gaseous mixture including $CF_4/Ar/N_2$ is passed. In both the first and the second over-etching operations, the substrate is placed inside a reaction chamber, and a gaseous mixture of etching gases including $CF_4/C_4F_8/CO/Ar/N_2$ is passed. Furthermore, the reaction chamber is set to a pressure of about 200 mT and a power rating of about 1500 Watts.

In this invention, the gaseous nitrogen ($N_2$), used together with the other etching gas mixture for forming a contact opening in an oxide layer, is able to clear away the by-product of the etching operation, namely, the polymers. Hence, when metal is subsequently deposited into the contact opening, the metal atoms will no longer react with polymer by-product to form a layer of high resistance material on the sidewalls of the opening, and compromising the reliability of the device.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
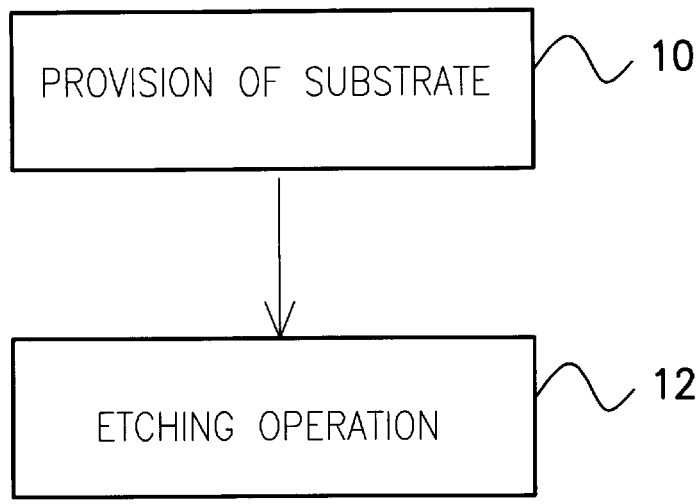
FIG. 1 is a block diagram illustrating the steps in carrying out a first conventional etching process.
Figure 2:
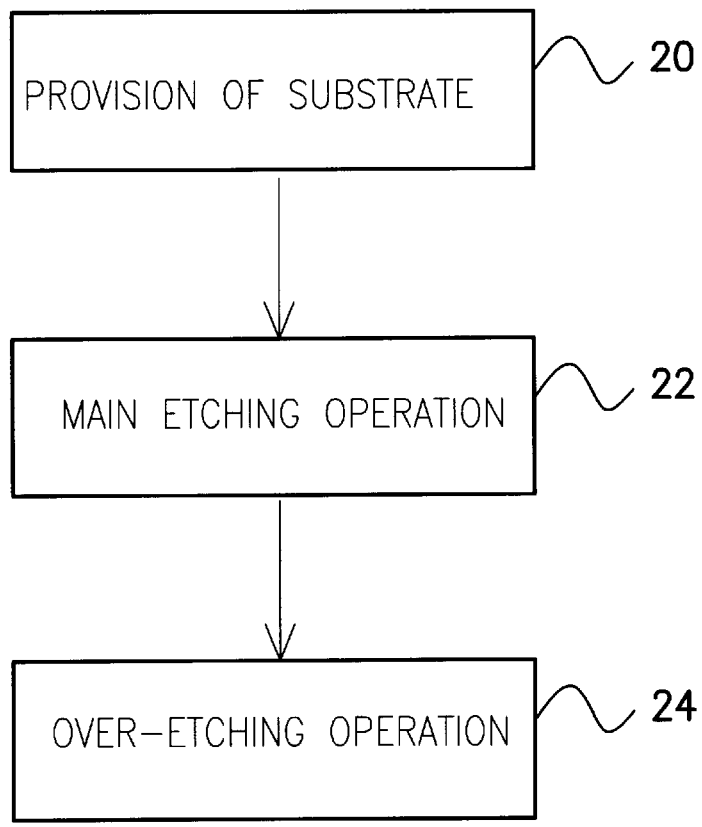
FIG. 2 is a block diagram illustrating the steps in carrying out a second conventional etching process.

Table 1A and Table 1B show the test results of using a first conventional etching process;

Table 2 shows the test results of carrying out the second conventional etching process;

FIG. 3 is a block diagram illustrating the steps in carrying out an etching process according to a first preferred embodiment of this invention;

FIG. 4 is a block diagram illustrating the steps in carrying out an etching process according to a second preferred embodiment of this invention;

Table 3A and Table 3B show the test results of using an etching process according to the first preferred embodiment of this invention; and Table 4 shows the test results of using an etching process according to the second preferred embodiment of this invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIG. 3 is a block diagram illustrating the steps in carrying out an etching process according to a first preferred embodiment of this invention. First, as shown in step 30 of FIG. 3, a substrate, for example, having an oxide layer, a silicon nitride layer, a photoresist layer or a polysilicon layer formed thereon, is provided. Next, the substrate is placed inside a reaction chamber to perform the substrate etching operation 32, wherein the gas pressure inside the reaction chamber is set to about 200 mT, the power rating set to about 1500 Watts. In this embodiment, a gaseous mixture of etching gases including $CF_4/C_4F_8/CO/Ar/N_2$ is passed into the reaction chamber, wherein the gas flow rates of $CF_4$, $C_4F_8$, CO, Ar and $N_2$ are preferably about 20, 4, 200, 600 and 20 SCCM, respectively. The method of this invention is capable of increasing the etching selectivity of oxide layer.

To illustrate the advantages of this invention, Table 3A and Table 3B below show the test results of using an etching process according to the first preferred embodiment of this invention. In the tables, PECVD represents plasma enhanced chemical vapor deposition method; hence, PECVD-Oxide and PECVD-Nitride represent plasma enhanced chemical deposited oxide layer and nitride layer respectively.

TABLE 3A

| | ETCHING RATE (Å/Min) |
|---|---|
| PECVD-Oxide | 4059 |
| PECVD-Nitride | 929 |
| Doped Polysilicon | 306 |
| Photoresist | 614 |

TABLE 3B

| | ETCHING SELECTIVITY |
|---|---|
| PECVD-Oxide/PECVD-Nitride | 4.37 |
| PECVD-Oxide/Doped Polysilicon | 13.3 |
| PECVD-Oxide/Photoresist | 6.6 |

When the results as shown in Tables 3A and 3B is compared with the results shown in Tables 1A and 1B, there are obvious improvements in using the etching method of this invention. The etching selectivity between PECVD-Oxide and PECVD-Nitride has increased from the conventional method of just 1.37 to about 4.37. Furthermore, the etching selectivity between PECVD-Oxide and doped polysilicon, as well as between PECVD-Oxide and photoresist are consistently higher than that produced by a conventional etching method.

FIG. 4 is a block diagram illustrating the steps of using an etching process according to a second preferred embodiment of this invention. First, as shown in step 40 of FIG. 4, a substrate, for example, having four-layered structure, is provided. The four-layered structure includes for example, a first layer of oxide preferably having a thickness of about 11000 Å, a second layer of silicon nitride preferably having a thickness of about 300 Å, a third layer of self-aligned silicide preferably having a thickness of about 500 Å and a fourth layer of polysilicon preferably having a thickness of about 3000 Å. The four layers given above are used as an illustration in this embodiment only, and therefore the substrate should not be restricted as such.

For example, as shown in step 40 of FIG. 4, a substrate is provided. An oxide layer preferably having a thickness of about 4000 Å is formed over the substrate by a thermal oxidation method, and then a BPTEOS layer having a thickness of about 7100 Å is formed over the oxide layer. Next, a main etching operation 42 is carried out for 60 seconds inside a reaction chamber. In the main etching operation 42, the gas pressure of the reaction chamber is set to about 300 mT and the power rating set to about 1300 Watts. In addition, a gaseous mixture of etching gases $CHF_3/CF_4/Ar$, where $CHF_3$, $CF_4$, Ar have gas flow rates of 30, 30 and 400 SCCM respectively, is passed into the reaction chamber.

Next, as shown in FIG. 4, a cleaning operation 44 is carried out for about 20 seconds followed by performing an over-etching operation 46 for about 60 seconds. Then, a first thickness monitoring of the BPTEOS layer is performed. Thereafter, another cleaning operation 48 is carried out for 20 seconds followed by another over-etching operation 50 for about 60 seconds. After that, a second thickness monitoring of the oxide layer is performed. In the cleaning operations 44 and 48, gas pressure in the reaction chamber is set to about 100 mT, and a gaseous mixture of $CF_4/Ar/N_2$ is passed into the reaction chamber, wherein the gas flow rate of $CF_4$, Ar and $N_2$ are 20, 600 and 20 SCCM, respectively. In the over-etching operations 46 and 50, the substrate is placed inside the reaction chamber, and then a mixture of etching gases including $CF_4/C_4F_8/CO/Ar/N_2$ is passed, wherein the gas flow rates of $CF_4$, $C_4F_8$, CO, Ar and $N_2$ are 20, 4, 200, 600 and 20 SCCM, respectively. Also, in the over-etching operations 46 and 50, the chamber pressure is set to about 200 mT, while the power rating is set to about 1500 Watts. The method of this invention is capable of preventing the deposition of polymers that will stop the etching action prematurely.

To illustrate the advantages of this invention, Table 4 below shows the test results of using the etching process according to the second preferred embodiment of this invention. When the results as shown in Table 4 is compared with the results shown in Table 2, there are obvious improvements in the addition of a cleaning operations in-between the etching operations to remove the deposited polymers. This can be seen in the second thickness monitoring figures, where the etching rate of the oxide is about 1904 (Å/min) compared with just 928 (Å/min) produced by the conventional method.

TABLE 4

| | Before Etching | First Thickness Monitoring (BPTEOS) | Second Thickness Monitoring (Thermal Oxide) |
|---|---|---|---|
| Thickness (Å) | 11172 | 3281 | 1373 |
| Etching Rate (Å/min) | | 3945 | 1904 |

In this invention, the gaseous nitrogen ($N_2$), used together with the other etching gas mixture for forming a contact opening in an oxide layer, is able to clear away the polymer by-product of the etching operation. Hence, when metal is subsequently deposited into the contact opening, the metal atoms will not react with the any polymers to form a layer of high resistance material on the sidewalls of the opening, and compromising the reliability of the device.

As a summary, advantages of using the etching method of this invention includes:

1. The use of a mixture of etching gases including $CF_4/C_4F_8/CO/Ar/N_2$ is capable of increasing the etching selectivity of oxide with respect to other materials.

2. The addition of a cleaning step between main and over-etching operations is able to remove the deposited polymers, thereby avoiding an etching stop due to a higher polymer deposition rate than the etching rate.

3. The introduction of gaseous nitrogen as a component of the cleaning gases helps to remove completely the polymers deposited on the sidewalls of a contact opening. Thus, there will be no sidewall polymers to react with subsequently deposited metal to form a layer of high resistance material, and hence device reliability is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An improved method for etching oxide capable of preventing etching stop before the end of a plasma-enhanced etching operation, comprising the steps of:

providing a substrate having an oxide layer formed thereon;

performing a main etching operation to etch the oxide layer using a first mixture of etching gases of $CHF_3/CF_4/Ar$;

performing a first cleaning operation to remove substantially most of a polymer by-product formed during the main etching operation using a mixture of cleaning gases, wherein the mixture of cleaning gases includes $CF_4/Ar/N_2$;

performing a first over-etching operation after the first cleaning operation to etch the oxide layer using a second mixture of etching gases, wherein the mixture of etching gases includes $CF_4/C_4F_8/CO/Ar/N_2$;

performing a second cleaning operation to remove substantially most of the polymer by-product formed during the first over-etching operation, wherein the mixture of cleaning gases in the first cleaning operation is used; and performing a second over-etching operation to etch the oxide layer using the second mixture of etching gases as in the first over etching operation.

2. The method of claim 1, wherein the gas flow rates of the first mixture of etching gases $CHF_3$, $CF_4$, and Ar are 30, 30 and 400 SCCM, respectively.

3. The method claim 1, wherein the step of performing the main etching operation includes placing the substrate into a reaction chamber with a pressure of about 300 mT.

4. The method claim 1, wherein the step of performing the main etching operation includes setting the power rating of a reaction chamber used for performing the main etching operation to about 1300 Watts.

5. The method of claim 1, wherein in the step of performing the first cleaning operation and the second cleaning operation, a reaction chamber is used with a pressure of about 200 mT.

6. The method of claim 1, wherein the step of performing the first cleaning operation and the second cleaning operation includes passing the mixture of cleaning gases $CF_4$, Ar and $N_2$ at gas flow rates of and 20, 600 and 20 SCCM, respectively.

7. The method of claim 1, wherein the second mixture of etching gases $CF_4$, $C_4F_8$, CO, Ar, and N have gas flow rates of 20, 4, 200, 600 and 20 SCCM, respectively.

8. The method of claim 1, wherein the step of performing the first and the second over-etching operations includes placing the substrate into a reaction chamber having a pressure of about 200 mT therein.

9. The method of claim 1, wherein the first and the second over-etching operations are performed in a reaction chamber having a power rating of about 1500 Watts.

10. The method of claim 1, wherein the step of performing the main etching operation, the first over-etching operation and the second over-etching operation includes conducting each operation for about 60 seconds.

11. The method of claim 1, wherein the step of performing the first and the second cleaning operations includes conducting each operation for about 20 seconds.

12. A method of etching an oxide layer which comprising a first portion formed by thermal oxidation and a second part of BPTEOS over a material layer, wherein the method comprising:

performing a main etching on the oxide layer for about 60 seconds, using $CHF_3/CF_4/N_2$ as etching gas with gas flow rates of about 30, 30 and 400 SCCM, respectively;

performing a first cleaning operation for about 20 seconds after the main etching step, using $CF_4/Ar/N_2$ as cleaning gases with gas flow rates of about 20, 600 and 20 SCCM, respectively;

performing a first over-etching operation for about 60 seconds, using $CF_4/C_4F_8/CO/Ar/N_2$ as etching gases with gas flow rates of about 20, 4, 260, 600 and 20, respectively;

performing a second cleaning operation for about 20 seconds, using the cleaning gases the same as those used in the first cleaning operation; and performing a second over-etching operation for about 60 seconds, using the etching gases used for the first over-etching operation.

* * * * *